United States Patent
Do et al.

[19]

[11] Patent Number: 5,859,552
[45] Date of Patent: Jan. 12, 1999

[54] PROGRAMMABLE SLEW RATE CONTROL CIRCUIT FOR OUTPUT BUFFER

[75] Inventors: Tuan P. Do, San Jose; Casimiro A. Stascausky, Fremont, both of Calif.

[73] Assignee: LSI Logic Corporation, Milpitas, Calif.

[21] Appl. No.: 904,743

[22] Filed: Aug. 1, 1997

Related U.S. Application Data

[63] Continuation of Ser. No. 539,985, Oct. 6, 1995, abandoned.

[51] Int. Cl.$^6$ .................................................. H03H 11/26
[52] U.S. Cl. ........................... 327/170; 327/276; 327/281
[58] Field of Search ................... 327/170, 108, 327/276, 281

[56] References Cited

U.S. PATENT DOCUMENTS

| | | | |
|---|---|---|---|
| 4,789,796 | 12/1988 | Foss | 307/443 |
| 4,820,942 | 4/1989 | Chan | 307/542 |
| 4,885,485 | 12/1989 | Leake et al. | 307/542 |
| 4,918,339 | 4/1990 | Shigeo et al. | 307/542 |
| 4,959,565 | 9/1990 | Knecht et al. | 307/542 |
| 4,987,324 | 1/1991 | Wong et al. | 307/451 |
| 4,992,676 | 2/1991 | Gerossa et al. | 307/443 |
| 5,036,232 | 7/1991 | Jungert et al. | 307/542 |
| 5,059,823 | 10/1991 | Ahsanullah | 307/443 |
| 5,111,075 | 5/1992 | Ferry et al. | 307/443 |
| 5,124,579 | 6/1992 | Naghshineh | 307/443 |
| 5,208,492 | 5/1993 | Masumoto et al. | 307/469 |
| 5,216,289 | 6/1993 | Hahn et al. | 307/270 |
| 5,231,311 | 7/1993 | Ferry et al. | 307/443 |
| 5,239,175 | 8/1993 | Peterson | 307/443 |
| 5,424,653 | 6/1995 | Folmsbee et al. | 326/26 |

*Primary Examiner*—Margaret Rose Wambach
*Attorney, Agent, or Firm*—D'Alessandro & Ritchie

[57] ABSTRACT

A slew rate control circuit for an output circuit of an integrated circuit includes an input node for obtaining an input signal and an output node for providing an output signal. A first stage of the control circuit includes at least one transistor having a control terminal and first and second main terminals. The control terminals of each at least one transistor are connected together to the input node. The first main terminal of each at least one transistor are connected to a voltage rail. The second main terminal of each at least one transistor is connected to the output node through its own individual resistor. One or more subsequent stages of the control circuit each contain at least one transistor having a control terminal and first and second main terminals. The control terminals of each at least one transistor in each one or more subsequent stages of the control circuit are connected together to a control node driven from the control terminals of the preceding stage through at least one inverter. The first main terminal of each at least one transistor are connected to a voltage rail. The second main terminal of each at least one transistor is connected to the output node through its own individual resistor. The at least one inverters associated with the one or more subsequent stages of the control circuit are sized so as to provide a predetermined amount of delay therethrough. In a user-programmable embodiment, the control terminals of each transistor are selectively connectable to the input node or to the output of any one of the inverters via switching elements.

8 Claims, 4 Drawing Sheets

5,859,552

PROGRAMMABLE SLEW RATE CONTROL CIRCUIT FOR OUTPUT BUFFER

CROSS-REFERENCE TO RELATED APPLICATION

This is a file-wrapper continuation of patent application Ser. No. 08/539,985, now abandoned filed Oct. 6, 1995.

BACKGROUND OF THE INVENTION

1. Field of the Invention.

The present invention relates to integrated circuit technology. More particularly, the present invention relates to slew rate and transient noise control circuits for use in integrated circuits.

2. The Prior Art.

Output buffer circuits are widely used to couple output signals from one integrated circuit to another. Among the important characteristics of an output buffer circuit are the slew rate, or rate of change of output voltage as a function of time, and the transient noise characteristics of the output signal. Both of these characteristics of a digital output signal may materially affect the ability to interface that signal to other devices in a digital system.

Numerous circuits are known in the prior art for controlling the slew rate and altering the transient noise characteristics of the output signal of an output buffer circuit. U.S. Pat. No. 4,789,796 to Foss discloses an output buffer having a sequentially switched output in which single transistors are turned on in sequence to control both pullup and pulldown slew rate of an output buffer. In a first embodiment, cascaded inverters provide the delay and in a second embodiment a falling signal fed to the inputs of three inverters having different voltage switching thresholds provides the delay.

U.S. Pat. No. 4,820,942 to Chan discloses a high drive output buffer with reduced ground bounce. The circuit uses different sized transistors having different turn-off and turn-on speed characteristics which are individually turned on at different times by cascaded inverter delay lines to reduce ground bounce in the output signal.

U.S. Pat. No. 4,885,485 to Leake et al discloses a mask programmable output buffer circuit which includes a plurality of output transistors and a metallization pattern which can be configured to provided cascaded turn on or simultaneous turn on of the plurality of transistors in either the pullup or pulldown configuration. The sources of adjacent pairs of pullup transistors are common and the drains of adjacent pairs of pulldown transistors are common. Custom metallization determines which pairs of pullup transistors have their sources connected to the output node of the buffer and which pairs of pulldown transistors have their drains connected to the output node of the buffer. Continuous distributed-resistance gates are used to provide an RC time delay for the turning on of individual transistors. The gates may be shorted by custom metal lines at intervals along their length corresponding to pairs of both pullup and pulldown transistors to speed up gate signal propagation for pairs of pullup and pulldown transistors.

U.S. Pat. No. 4,918,339 to Shigeo et al. discloses a circuit which sequentially turns on two individual pulldown transistors. The signal which turns on the second transistor is delayed through a delay circuit.

U.S. Pat. No. 4,959,565 to Knecht et al. discloses an output buffer comprising a plurality of pullup or pulldown transistors connected in parallel. A desired amount of resistance is distributed in the gate lines of the transistors, thus providing a distributed RC time delay to sequentially turn on successive individual transistors.

U.S. Pat. No. 4,987,324 to Wong et al. discloses an output buffer circuit with a controlled slew rate. The buffer comprises four inverters, one of which has its P and N channel transistors separately controlled from the outputs of two of the inverters having different switching threshold characteristics.

U.S. Pat. No. 4,992,676 to Gerosa et al. discloses an output buffer comprising a plurality of pullup and pulldown transistors functioning as complementary pairs. Single inverters are used to time cascade the drive signals to the gates of the successive complementary pairs of output transistors.

U.S. Pat. No. 5,036,232 to Jungert et al. discloses a push-pull output buffer stage with successive stages turning on to control slew rate. A distributed RC network comprising discrete resistance elements is used to control successive turn on of complimentary pairs of transistors.

U.S. Pat. No. 5,059,823 to Ahsanullah discloses a supply bounce controlled output buffer circuit. Single pullup and pulldown transistors are controlled by cascaded inverter delay lines from the power supply rails.

U.S. Pat. Nos. 5,111,075 and 5,231,311 to Ferry et al. disclose an output buffer circuit with reduced switching noise. Successive stages comprising complementary transistor pairs are sequentially turned on by an RC time delay network aided by diode bypass networks.

U.S. Pat. No. 5,124,579 to Naghshineh discloses an output buffer with improved ground bounce. Successive stages of complementary transistor pairs are sequentially turned on by an RC time delay network employing transmission gates as the delay elements.

U.S. Pat. No. 5,216,289 to Hahn et al. discloses an output buffer circuit having an output node which may also be used as an input node. The circuit operates by sequentially turning on individual output driver transistors to gradually charge the output node to a high voltage after which the drive to the output driver transistors is turned off.

U.S. Pat. No. 5,329,175 to Peterson discloses an output buffer having multiple stages which are turned on sequentially to avoid transient noise. The circuit operates by sequentially turning on complimentary transistor pairs. Feedforward transistors are used to assure simultaneous turnoff of all pullup and pulldown transistors.

U.S. Pat. No. 5,424,653 to Folmsbee et al. discloses a gradual on output buffer circuit. A plurality of output transistors, gradually increasing in size, are turned off sequentially from the largest to the smallest to reduce VCC bounce.

While the prior art has provided numerous solutions to the problem of providing a controlled slew rate or reduced noise at the output of a digital buffer amplifier, there still remains room for improvement.

BRIEF DESCRIPTION OF THE INVENTION

A slew rate control circuit for an output circuit of an integrated circuit includes an input node for obtaining an input signal and an output node for providing an output signal. A first stage of the control circuit includes a first predetermined number of transistors each having a control terminal and first and second main terminals. The control terminals of each first predetermined number of transistors are connected together to the input node. The first main terminal of each first predetermined number of transistors are connected to a voltage rail. The second main terminal of each first predetermined number of transistors is connected to the output node through its own individual resistor.

One or more subsequent stages of the control circuit each contain a predetermined number of transistors each having a control terminal and first and second main terminals. The control terminals of each predetermined number of transistors in each one or more subsequent stages of the control circuit are connected together to a control node driven from the control terminals of the preceding stage through a delay element. The first main terminal of each first predetermined number of transistors are connected to a voltage rail. The second main terminal of each first predetermined number of transistors is connected to the output node through its own individual resistor. The delay times of the delay elements associated with the one or more subsequent stages of the control circuit are selected so as to provide a predetermined amount of delay therethrough.

The slew rate control circuit of the present invention may be provided as either a fixed circuit or as a programmable circuit. In a programmable embodiment of the slew rate control circuit of the present invention, the control terminals of each transistor are selectively connectable to the input node or to the output of any one of the inverters via connecting means such as mask-programmable contacts, pass gates controlled by one of a number of programming mechanisms such as registers, memory cells, antifuses, fuses, etc.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

The slew rate control circuit for an output circuit of an integrated circuit may be configured as a pullup circuit embodiment or as a pulldown circuit embodiment. The pullup and pulldown circuit embodiments may be combined as is known in the art to perform both pullup and pulldown functions, with the programmable slew rates of the pullup and pulldown sections being independently controllable.

Figure 1:
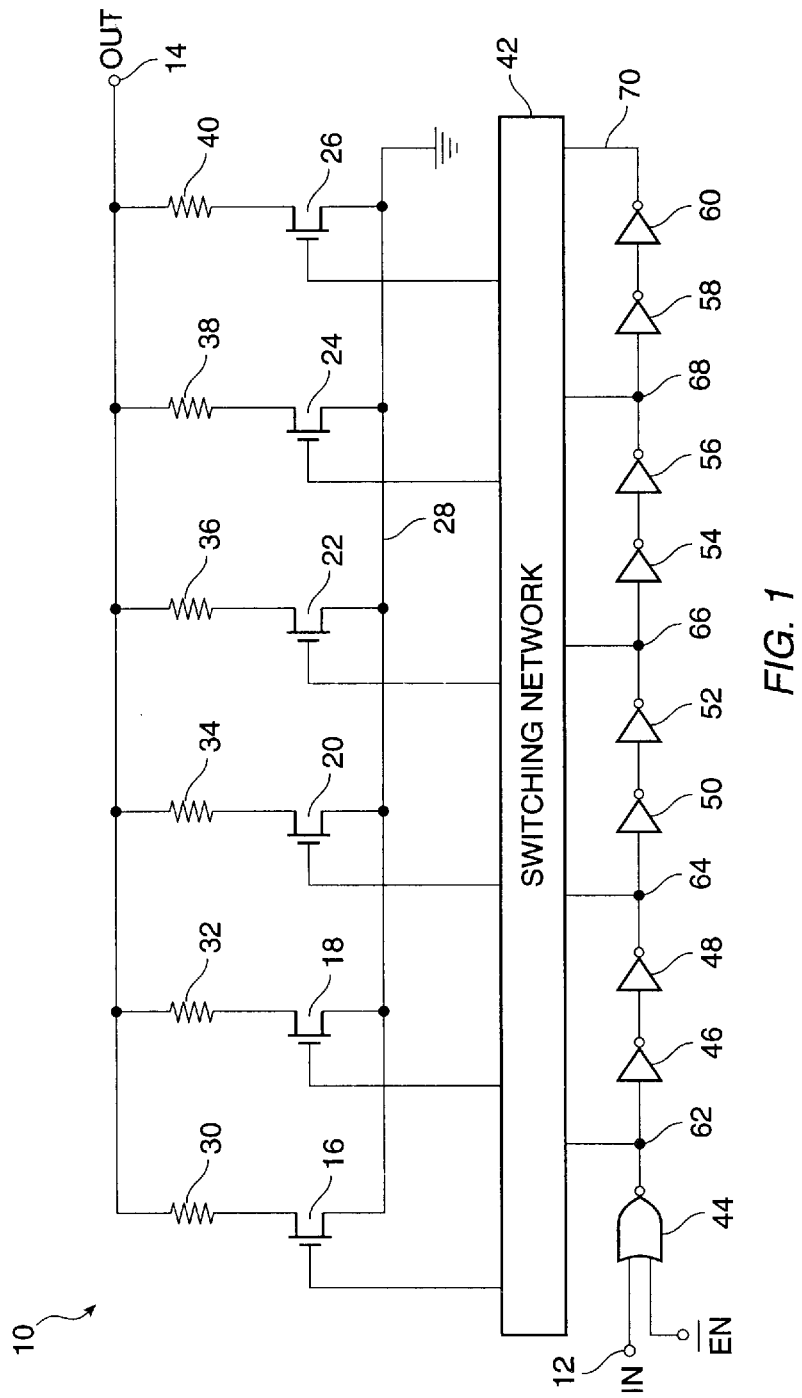
FIG. 1 is a schematic diagram of a programmable pulldown slew rate controller circuit according to a presently preferred embodiment of the invention.

Referring first to FIG. 1, a schematic diagram of a programmable pulldown slew rate controller circuit 10 according to a presently preferred embodiment of the invention is shown. Programmable pulldown slew rate controller circuit 10 includes an input node 12 to which input signals are applied to the circuit, and an output node 14 for supplying output signals the slew rates of which are to be controlled according to the present invention.

A plurality of N-Channel MOS transistors 16, 18, 20, 22, 24, and 26 have their sources connected to the ground voltage rail 28 and their drains connected to output node 14 through resistors 30, 32, 34, 36, 38, and 40, respectively. As presently preferred, all of N-Channel MOS transistors 16, 18, 20, 22, 24, and 26 are sized the same to have equal conductivity. Using identical size transistors makes layout of slew rate control circuit 10 relatively easy. Also, resistors 30, 32, 34, 36, 38, and 40 preferably have the same value, about 22 ohms as presently preferred. Those of ordinary skill in the art will recognize that the purpose of resistors 30, 32, 34, 36, 38, and 40 is for protection of the transistors 16, 18, 20, 22, 24, and 26 and that the resistors may be omitted if protection circuits are not employed.

Although not shown in FIG. 1, those of ordinary skill in the art will recognize that a pair of protection diodes comprising for example a diode-connected P-Channel and a diode connected N-Channel MOS transistors could be connected between the drains of N-Channel MOS transistors 16, 18, 20, 22, 24, and 26 and VDD and ground voltage rails respectively as is well known in the art. Such skilled persons will also realize that while the illustrative embodiment of FIG. 1 shows six N-Channel MOS transistors, the invention is not limited to slew rate control circuits employing that number of transistors and that any number of transistors may be employed depending on the particular application for which the circuit of the present invention is used.

The gates of N-Channel MOS transistors 16, 18, 20, 22, 24, and 26 are driven from a switching network 42. The function of switching network 42 is to provide the gate drive signals to N-Channel MOS transistors 16, 18, 20, 22, 24, and 26 from among several gate drive signal sources derived from the input signal at input node 12. As will be appreciated by persons of ordinary skill in the art from further disclosure herein, switching network 42 may comprise a variety of connective mechanisms, such as mask-programmable contacts, or pass gates driven from registers, memory cells, fuses or antifuses, etc. Thus, embodiments of the invention are possible in which the slew rate of the output signal is fixed at the time of manufacture by use of mask programming, and other embodiments of the invention are possible in which the slew rate of the output signal may be adjusted after the integrated circuit containing the circuit of the present invention has been fabricated and packaged, either by the manufacturer or by an end user.

The gate drive signal sources for N-Channel MOS transistors 16, 18, 20, 22, 24, and 26 comprise one of a plurality of gate drive signals available from a delay chain. As presently preferred, the delay chain comprises NOR gate 44 and inverter pairs 46 and 48, 50 and 52, 54 and 56, and 58 and 60. Gate drive node 62 is the output of NOR gate 44; gate drive node 64 is the output of inverter 48; gate drive node 66 is the output of inverter 52; gate drive node 68 is the output of inverter 56; and gate drive node 70 is the output of inverter 60. Those of ordinary skill in the art will immediately appreciate that the signal at gate drive node 64 is delayed from the signal at gate drive node 62 by two inverter delays, the signal at gate drive node 66 is delayed from the signal at gate drive node 62 by four inverter delays, the signal at gate drive node 68 is delayed from the signal at gate drive node 62 by six inverter delays, and the signal at gate drive node 70 is delayed from the signal at gate drive node 62 by eight inverter delays. As will be appreciated by those of ordinary skill in the art, the delay chain could comprise other means, such as RC delays and other equivalent delay circuits, as is known in the art. Such skilled persons will also recognize that pass gates or other switching means, such as antifuses or mask programmable layers, may be used to shunt selected ones of the inverter pairs 46–48, 50–52, 54–56, and 58–60 to impart programmability to the circuit of FIG. 1.

NOR gate 44 functions as an enable gate, and disables the output 14 when the enable signal is high thus driving its output low. When the output of NOR gate 44 is low, the outputs of inverters 48, 52, 56, and 60 are also low. Because the outputs of inverters 48, 52, 56, and 60 are all low, gate drive nodes 62, 64, 66, 68, and 70 are also all low. Thus none of N-Channel MOS transistors 16, 18, 20, 22, 24, or 26 are turned on causing output node 14 to float at a high impedance state.

According to the present invention, any number of the N-Channel MOS transistors may be driven from any one of the gate drive nodes. The greater the number of transistors which are driven from a single gate line, the greater the conductivity and current flow while those transistors are turned on. This provides a great degree of flexibility for slew rate control and permits a large number of fall time or rise time slew rate profiles depending on the number of transistors employed.

The slew rate control circuit of the present invention may also be configured as a pullup circuit. Such an embodiment is shown in the schematic diagram of FIG. 2. Those skilled in the art will recognize the similarity of the circuits shown in FIGS. 1 and 2. Programmable pullup slew rate controller circuit 80 includes an input node 82 to which input signals are applied to the circuit, and an output node 84 for supplying output signals the slew rates of which are to be controlled according to the present invention.

A plurality of P-Channel MOS transistors 86, 88, 90, 92, 94, and 96 have their sources connected to the VDD voltage rail 98 and their drains connected to output node 84 through resistors 100, 102, 104, 106, 108 and 110, respectively. As presently preferred, like the N-Channel transistors in the embodiment of FIG. 1, all of P-Channel MOS transistors 86, 88, 90, 92, 94, and 96 are sized the same to have equal conductivity and resistors 100, 102, 104, 106, 108 and 110, are preferably equal, have values in the range of their counterparts in FIG. 1, or may be omitted as was the case with the circuit of FIG. 1.

Figure 2:
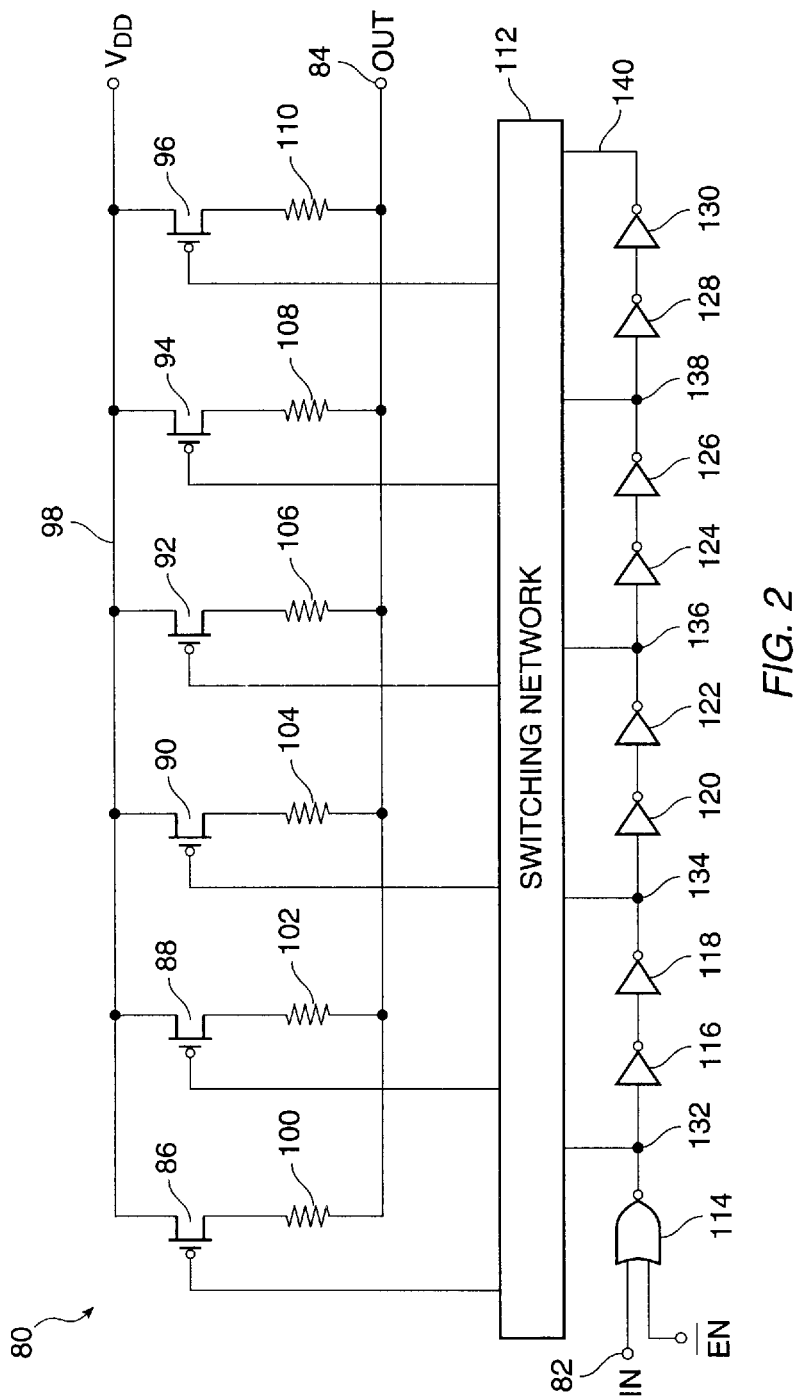
FIG. 2 is a schematic diagram of a programmable pullup slew rate controller circuit according to a presently preferred embodiment of the invention.

As in the embodiment of FIG. 1, a pair of protection diodes comprising for example a diode-connected P-Channel and a diode connected N-Channel MOS transistors (not shown) could be connected between the drains of P-Channel MOS transistors 86, 88, 90, 92, 94, and 96 and VDD and ground voltage rails respectively as is well known in the art. Persons of ordinary skill in the art will realize that while the illustrative embodiment of FIG. 2 shows six P-Channel MOS transistors, the invention is not limited to slew rate control circuits employing that number of transistors and that any number of transistors may be employed depending on the particular application for which the circuit of the present invention is used.

The gates of P-Channel MOS transistors 86, 88, 90, 92, 94, and 96 are driven from a switching network 112. The function of switching network 112 is identical to that of switching network 42 of FIG. 1, namely to provide the gate drive signals to P-Channel MOS transistors 86, 88, 90, 92, 94, and 96 from among several gate drive signal sources derived from the input signal at input node 82. As will be appreciated by persons of ordinary skill in the art from further disclosure herein, switching network 112 may comprise a variety of connective mechanisms, such as mask-programmable contacts, or pass gates driven from registers, memory cells, fuses or antifuses, etc. Thus, embodiments of the pullup version of the present invention are also possible in which the slew rate of the output signal is fixed at the time of manufacture by use of mask programming, and other embodiments of the invention are possible in which the slew rate of the output signal may be adjusted after the integrated circuit containing the circuit of the present invention has been fabricated and packaged, either by the manufacturer or by an end user. As in the embodiment of FIG. 1, the switching network may be employed to bypass selected inverter pairs in the time delay chain.

The gate drive signal sources for P-Channel MOS transistors 86, 88, 90, 92, 94, and 96 comprise one of a plurality of gate drive signals available from a delay chain preferably comprising NOR gate 114 and inverter pairs 1 16 and 1 18, 120 and 122, 124 and 126, and 128 and 130. Gate drive node 132 is the output of NOR gate 114; gate drive node 134 is the output of inverter 118; gate drive node 136 is the output of inverter 122; gate drive node 138 is the output of inverter 126; gate drive node 140 is the output of inverter 130. Those of ordinary skill in the art will immediately appreciate that the signal at gate drive node 134 is delayed from the signal at gate drive node 132 by two inverter delays, the signal at gate drive node 136 is delayed from the signal at gate drive node 132 by four inverter delays, the signal at gate drive node 138 is delayed from the signal at gate drive node 132 by six inverter delays, and the signal at gate drive node 140 is delayed from the signal at gate drive node 132 by eight inverter delays.

Like NOR gate 44 in the embodiment of FIG. 1, NOR gate 114 functions as an enable gate, and disables the output 84 when the enable signal is high thus driving its output low. When the output of NOR gate 114 is low, the outputs of inverters 46, 50, 54, and 58 are also low. Because the outputs of inverters 118, 122, 126, and 130 are all low, gate drive nodes 132, 134, 136, 138, and 140 are also all low. Thus none of P-Channel MOS transistors 86, 88, 90, 92, 94, or 96 are turned on causing output node 14 to float at a high impedance state.

As in the similar embodiment of FIG. 1, any number of the P-Channel MOS transistors may be driven from any one of the gate drive nodes. The greater the number of transistors which are driven from a single gate line, the greater the conductivity and current flow while those transistors are turned on. This provides a great degree of flexibility for slew rate control and permits a large number of fall time or rise time slew rate profiles depending on the number of transistors employed.

A combination pullup/pulldown embodiment of the present invention can be readily contemplated by persons of ordinary skill in the art from an examination of FIGS. 1 and 2 together. In such an embodiment, the output node 14 of the circuit of FIG. 1 and the output node 84 of the circuit of FIG. 2 would be commonly connected to one another, and could thus be pulled down to the ground voltage rail by the N-Channel transistors in FIG. 1 and could also be pulled up to the VDD voltage rail by the P-Channel transistors of the circuit of FIG. 2.

As has been disclosed herein, different numbers of transistors may be controlled by the different gate drive lines in the slew rate control circuit according to the present invention. A particular example of such a circuit is shown in FIG. 3.

Figure 3:
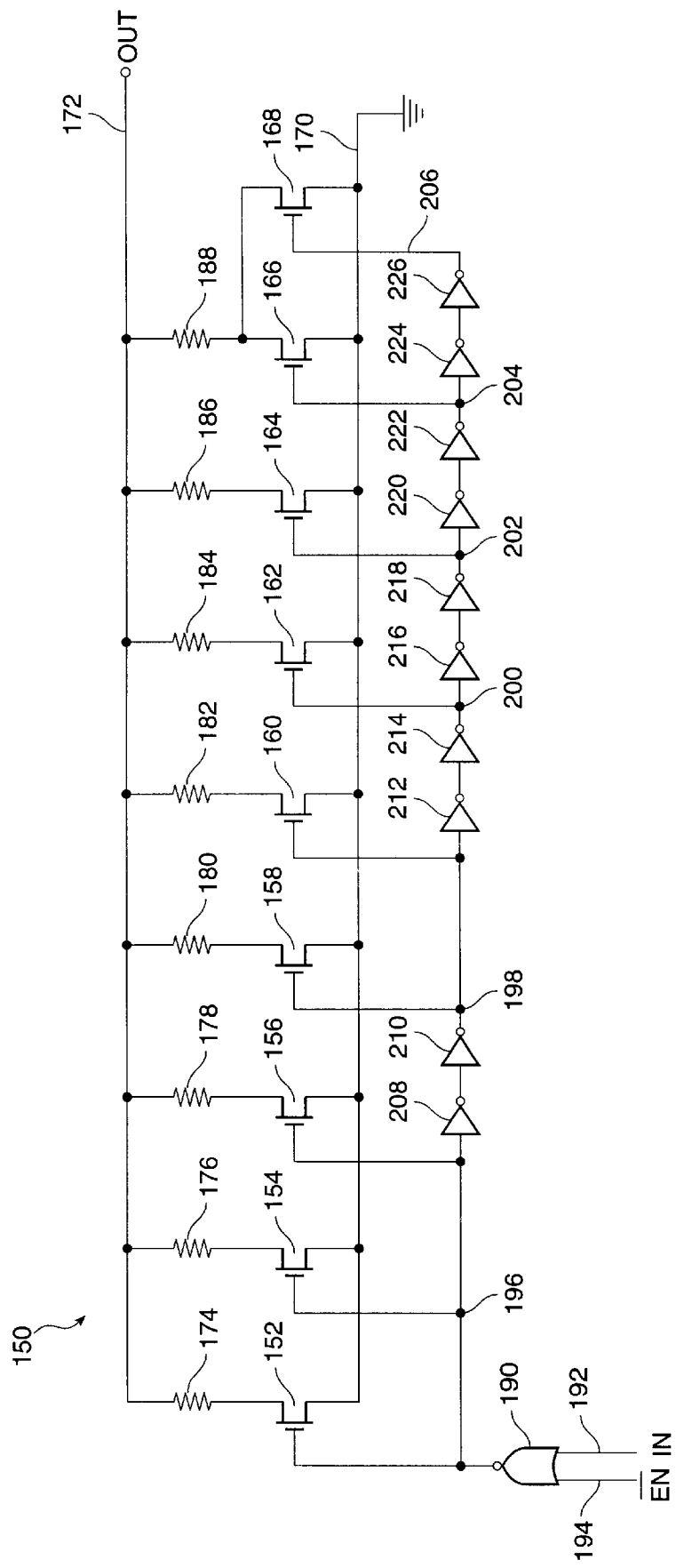
FIG. 3 is a schematic diagram of a specific embodiment of a pulldown slew rate controller circuit according to the invention.

Referring now to FIG. 3, a particular pulldown output buffer slew control circuit 150 is shown in schematic diagram form. Nine N-Channel MOS transistors 152, 154, 156, 158, 160, 162, 164, 166, and 168 have their sources connected to ground voltage rail 170. The drains of N-Channel MOS transistors 152, 154, 156, 158, 160, 162, 164, and 166 are connected to output node 172 through resistors 174, 176, 178, 180, 182, 184, 186, and 188, respectively. The drains of transistors 166 and 168 are connected together so that transistor 168 shares resistor 188 with transistor 166 as a means to sink current from the output node 172. Transistor 168 is preferably a weak device (approximately one fifth the conductivity of the previous stages) in order to minimize the shoot up of the output signal.

NOR gate 190 has one input tied to input node 192 and a second input tied to enable input 194. The output of NOR gate 190 at gate drive node 196 drives the gates of transistors 152, 154, and 156. The gates of transistors 158 and 160 are driven from first gate drive node 198. The gate of transistor 162 is driven from second gate drive node 200. The gate of transistor 164 is driven from third gate drive node 202. The gate of transistor 166 is driven from fourth gate drive node 204. The gate of transistor 168 is driven from fifth gate drive node 206.

The first delay element driving first gate drive node 198 comprises a pair of inverters 208 and 210. The second delay element driving second gate drive node 200 comprises a pair of inverters 212 and 214. The third delay element driving third gate drive node 202 comprises a pair of inverters 216 and 218. The fourth delay element driving fourth gate drive node 204 comprises a pair of inverters 220 and 222. The fifth delay element driving fifth gate drive node 206 comprises a pair of inverters 224 and 226. Inverter pairs 208–210, 212–214, 216–218, 220–222, and 224–226 are sized so as to produce delays of about one sixth of the desired rise time of the output signal.

As previously disclosed herein, it is presently preferred to utilize cascaded inverters as the delay chain for the gate drive signals supplied to the successive stages of the control circuitry of the output buffer of the present invention. As will be appreciated by those of ordinary skill in the art, the time delay presented by the inverters can be controlled by controlling the sizes of the transistors comprising the inverters.

The inverter pairs 46/48, 50/52, 54/56 and 58/60 in FIG. 1 will delay the signals applied to the gates of transistors 16, 18, 20, 22, 24, 26. The shorter the delay the faster the slew rate.

The slew rate at gate drive node 62 which is directly controlled by NOR gate 44, the slew rate at gate drive node 64 which is directly controlled by inverter 48, and the slew rates at gate drive nodes 66, 68 and 70, directly controlled by inverters 52, 56 and 60, will have an effect on the linearity of the output waveform at output node 14. If this slew rate is too fast, an output waveform with discontinuous shape, i.e., "steps" during rise or fall times will be produced. Inverters 46, 50, 54 and 58 will have less influence on the "stepping" because they will have more secondary effects on the slew rates at gate drive nodes 64, 66, 68 and 70.

Based on these considerations it can be seen that sizing of inverters 48, 52, 56 and 60 should be used to smooth the output waveform, and sizing of inverters 46, 50, 54 and 78 should be used to control the propagation delay to turn on or off the output transistors. More specifically, inverters 48, 52, 56, and 60 should be sized to have a slower rise time than fall time and inverters 46, 50, 54 and 78 should be sized to have a slower fall time than rise time. The net effect is to produce a slower fall time on the node at the output of the second inverter in each pair.

The inductance at the output node 14 pin together with its parasitic capacitance comprise a very high frequency low pass filter that acts to filter out the "steps". If the slew rate required is too slow (long rise or fall times) the "steps" could be relatively long and could create excessive waveform distortion. To improve the waveform a longer string of output transistors (16, 18, 20, 22, 24 and 26) with their corresponding delays should be used. Then the number of steps will increase but the effect of each will be less drastic.

Figure 4:
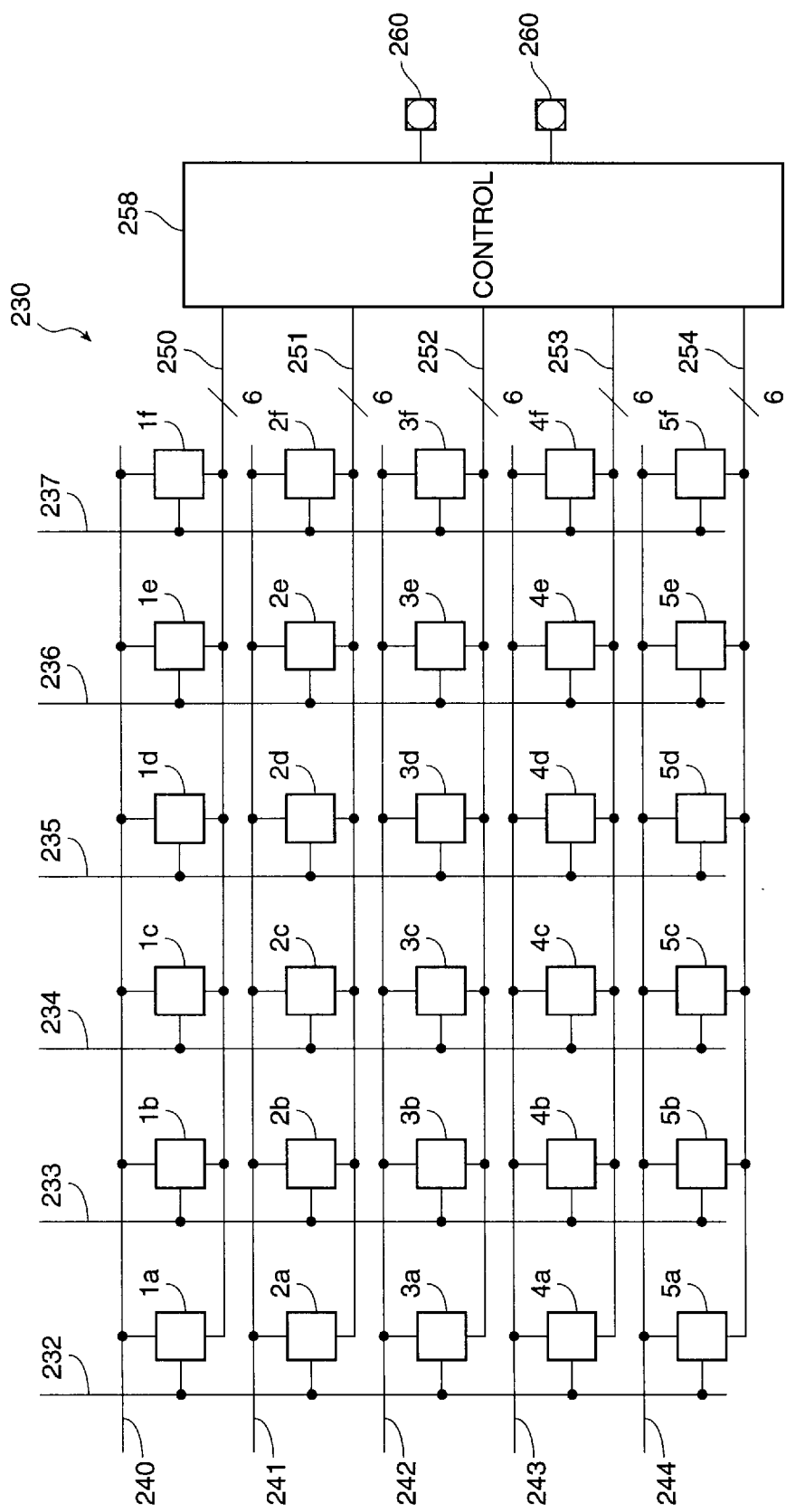
FIG. 4 is a schematic diagram of a specific embodiment of a switching network and control circuit according to the invention.

Referring now to FIG. 4, an exemplary switching network and control circuit 230 therefor is illustrated in schematic/block diagram form. Switching network and control circuit 230 will be understood by those of ordinary skill in the art to include switching networks 42 and 112 of FIGS. 1 and 2, respectively.

The switching network depicted in FIG. 4 shows connectability between six gate lines 232, 233, 234, 235, 236 and 237, and respectively, and five intersecting gate drive nodes, represented by conductors 240, 241, 242, 243, and 244, respectively. The gate lines and gate drive nodes are shown intersecting for convenience and ease of disclosure, and a requirement for physical layout intersection is unnecessary in actual embodiments of the present invention.

Those of ordinary skill in the art will readily recognize that switching network and control circuit 230 may comprise switching network 42 of FIG. 1 by connecting the gates of the plurality of N-Channel MOS transistors 16, 18, 20, 22, 24, and 26 of FIG. 1 to gate lines 232, 233, 234, 235, 236, and 237, respectively, and connecting the gate drive nodes 62, 64, 66, 68, and 70 of FIG. 1 to gate drive nodes 240, 241, 242, 243, and 244, respectively. Likewise, switching network and control circuit 230 may comprise switching network 112 of FIG. 2 by connecting the gates of the plurality of P-Channel MOS transistors 86, 88, 90, 92, 94, and 96 of FIG. 2 to gate lines 232, 233, 234, 235, 236, and 237, respectively, and connecting the gate drive nodes 132, 134, 136, 138, and 140 of FIG. 2 to gate drive nodes 240, 241, 242, 243, and 244, respectively.

Switch elements (shown as boxes identified by reference numerals 1a–1f, 2a–2f, 3a–3f, 4a–4f, and 5a–5f) are disposed at the intersections of gate lines 232, 233, 234, 235, 236, and 237 and gate drive nodes 240, 241, 242, 243, and 244. Switch elements 1a–1f, 2a–2f, 3a–3f, 4a–4f, and 5a–5f may be any one of a number of elements, such as pass gates, antifuses, mask programmable contacts, etc. As presently preferred, switch elements 1a–1f, 2a–2f, 3a–3f, 4a–4f, and 5a–5f comprise well known pass gates comprising a parallel combination of an N-Channel MOS transistor and a P-Channel MOS transistor in parallel, their gates driven by complementary signals (e.g., an inverter driving the gate of one of the transistors depending on the desired polarity of the enable signal).

The control leads from the pass gates or other switching elements (schematically represented by control lines 250, 251, 252, 253, and 254 are driven from control circuit 258. Control circuit 258 may be configured from a variety of circuit elements as is well known in the art. Such circuit elements include RAM or other non-volatile memory cells, shift register chains, or the like. Information defining which switch elements are to be activated may be entered from outside the integrated circuit via one or more I/O pads (two such illustrative I/O pads 260 are depicted) using well-known data entry techniques.

Those of ordinary skill in the art will readily recognize that FIG. 4 is merely illustrative and that other numbers of gate lines and gate drive nodes could be serviced by such a network. Such skilled persons will also readily observe that while the intersections of the gate lines and gate drive nodes are shown fully populated by switch elements, less than 100% population could be employed without departing from the scope of the present invention.

Switching network 42 could be also used to control rise and fall time slew rates independent of each other by two independent delay strings. This feature could be implemented using transmission gates that will connect the gates of transistors 16, 18, 20, 22, 24 and 26 to a first string of inverters or other delay elements during signal rise time and to a second string of inverters or other delay elements during signal fall time. Such configurations could have great flexibility. For example, transistors 16 and 18 could be connected to a common node (e.g. gate drive node 62) during rise time and they could be connected to different nodes in either the same string of inverters or a different string of inverters during fall time, thus allowing slew rates of the rising and falling signal to be differently and independently controlled.

By selecting the size (or the quantity of parallel transistors in a gate array configuration) of transistors 16, 18, 20, 22, 24 and 26 the slew rate could be adjusted at different points of the rising or falling edges. Then the effect of different RC constants on the output could be compensated by using this technique.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A slew rate control circuit for an output circuit of an integrated circuit including:

an input node for receiving an input signal;

an output node for prodding an output signal;

a plurality of cascaded delay circuits, each delay circuit having an input and an output, each delay circuit having a time delay selected so as to provide a predetermined amount of delay from the input to the output thereof, the input of a first one of said delay circuits coupled to said input node forming an undelayed control node, the outputs of said cascaded delay circuits forming successively delayed control nodes;

a plurality of pullup stages, each stage having at most one pullup transistor, each pullup transistor having a control terminal and first and second main terminals, the first main terminal of each pullup transistor coupled to a voltage rail, the second main terminal of each pullup transistor coupled to said output node;

a programmable switching circuit connected between the control terminals of ones of said pullup transistors and the undelayed control node and the successively delayed control nodes; and a control circuit, responsive to programming information, configured to selectively connect the control terminal of any number of said pullup transistors to either the undelayed control node, each of the successively delayed control nodes, or said voltage rail.

2. The circuit of claim 1 wherein each delay circuit comprises a pair of cascaded inverters, each of said inverters sized so as to provide a predetermined amount of delay therethrough.

3. A slew rate control circuit for an output circuit of an integrated circuit including:

an input node for receiving an input signal;

an output node for providing an output signal;

a plurality of cascaded delay circuits, each delay circuit having an input and an output, each delay circuit having a time delay selected so as to provide a predetermined amount of delay from the input to the output thereof, the input of a first one of said delay circuits coupled to said input node forming an undelayed control node, the outputs of said cascaded delay circuits forming successively delayed control nodes;

a plurality of pulldown stages, each stage having at most one pulldown transistor, each pulldown tansistor having a control terminal and first and second main terminals, the first main terminal of each pulldown transistor coupled to a voltage rail, the second main terminal of each pulldown transistor coupled to said output node;

a programmable switching circuit comprising a plurality of switches connected between the control terminals of ones of said pulldown transistors and the undelayed control node and the successively delayed control nodes; and a control circuit, responsive to programming information, configured to selectively connect the control terminal of each of said pulldown transistors to either the undelayed control node, any one of the successively delayed control nodes, or said voltage rail.

4. The circuit of claim 3 wherein each delay circuit comprises a pair of cascaded inverters, each of said inverters sized so as to provide a predetermined amount of delay therethrough.

5. A slew rate control circuit for an output circuit of an integrated circuit including:

an input node for receiving an input signal;

an output node for providing an output signal;

a first control circuit stage including 1 to n first control sub-stages, each first control sub-stage having at most one first control sub-stage transistor, each first control sub-stage transistor having a control terminal and first and second main terminals, the control terminals of each first control sub-stage transistor coupled to said input node, the first main terminal of each first control sub-stage transistor coupled to a voltage rail, the second main terminal of each first control sub-stage transistor coupled to said output node;

at least one subsequent control circuit stage each including 1 to n subsequent control sub-stages, each subsequent control sub-stage having at most one subsequent control sub-stage transistor, each subsequent control sub-stage transistor having a control terminal and first and second main terminals, the first main terminal of each subsequent control sub-stage transistor in each subsequent control circuit stage coupled to said voltage rail, the second main terminal of each subsequent control sub-stage transistor in each subsequent control circuit stage coupled to said output node; and a delay circuit associated with each subsequent control circuit stage and coupled to said input node, each delay circuit coupled to the control terminals of all subsequent control sub-stage transistors the subsequent control stage with which it is associated, each delay circuit comprises a pair of cascaded inverters, each of said inverters sized so as to provide a predetermined amount of delay therethrough.

6. A programmable slew rate control circuit for an output circuit of an integrated circuit including:

an input node for receiving an input signal;

an output node for providing an output signal;

a plurality of control stages, each control stage having at most one control stage transistor, each control stage transistor having a control terminal and first and second main terminals, the first main terminal of each control stage transistor coupled to a voltage rail, the second main terminal of each control stage transistor coupled to said output node;

a plurality of cascaded inverters each having an input and an output, a first one of said inverters having its input connected to said input node, each of said inverters sized so as to provide a predetermined amount of delay therethrough, said plurality of cascaded inverters forming a plurality of successively delayed control nodes at inputs and outputs thereof;

a plurality of pass gates, each of said pass gates connected between the control terminals of a selected one of said control stage transistors and a selected one of said successively delayed control nodes; and means for selectively activating ones of said plurality of pass gates to connect the control terminal of each one of said control stage transistors to a selected one of said successively delayed control nodes.

7. A slew rate control circuit for an output circuit of an integrated circuit including:

an input node for receiving an input signal;

an output node for providing an output signal;

a first control circuit stage including three first control sub-stages, each control sub-stage including at most one first control sub-stage transistor, each first control sub-stage transistor having a control terminal and first and second main terminals, the control terminals of each first control sub-stage transistor coupled to said input node, the first main terminal of each first control sub-stage transistor coupled to a voltage rail, the second main terminal of each first control sub-stage transistor coupled to said output node;

a second control circuit stage including two second control sub-stages, each second control sub-stage including at most one second control sub-stage transistor, each second contol sub-stage transistor having a control terminal and first and second main terminals, the control terminals of each second control sub-stage transistor coupled to a first delayed control node, the first main terminal of each second control sub-stage tansistor coupled to said voltage rail, the second main terminal of each second control sub-stage transistor coupled to said output node;

a third control circuit stage including a third control sub-stage including at most one third control sub-stage transistor having a control terminal and first and second main terminals, the control terminal of said third control sub-stage tmansistor coupled to a second delayed control node, the first main terminal of said third control sub-stage transistor coupled to said voltage rail, the second main terminal of said third control sub-stage transistor coupled to said output node;

a fourth control circuit stage including a fourth control sub-stage including at most one fourth control sub-stage having a control terminal and first and second main terminals, the control terminal of said fourth control sub-stage transistor coupled to a third delayed control node, the first main terminal of said fourth control sub-stage transistor coupled to said voltage rail, the second main terminal of said fourth control sub-stage transistor coupled to said output node;

a fifth control circut stage including a fifth control sub-stage including at most one fifth control sub-stage transistor having a control terminal and first and second main terminals, the control terminal of said fifth control sub-stage transistor coupled to a fourth delayed control node, the first main terminal of said fifth control sub-stage transistor coupled to said voltage rail, the second main terminal of said fifth control sub-stage transistor coupled to said output node;

a sixth control circuit stage including a sixth control sub-stage including at most one sixth control sub-stage transistor having a control terminal and first and second main terminals, the control terminal of said sixth control sub-stage transistor coupled to a fifth delayed control node, the first main terminal of said sixth control sub-stage tansistor coupled to said voltage rail, the second main terminal of said sixth control sub-stage transistor coupled to said output node;

a first pair of cascaded inverters connected between said input node and said first delayed control node;

a second pair of cascaded inverters connected between said first delayed control node and said second delayed control node;

a third pair of cascaded inverters connected between said second delayed control node and said third delayed control node;

a fourth pair of cascaded inverters connected between said third delayed control node and said fourth delayed control node; and a fifth pair of cascaded inverters connected between said fourth delayed control node and said fifth delayed control node;

wherein each inverter in said first through fifth pairs of cascaded inverters is sized so as to provide a predetermined amount of delay therethrough.

8. A slew rate control circuit for an output circuit of an integrated circuit including:

input means for receiving an input signal;

output means for providing an output signal;

a plurality of switch means for making a connection between a voltage rail and said output means;

a first delay means connected to said input node for generating a first delayed input signal;

a second delay means connected to said input node for generating a second delayed input signal;

a third delay means connected to said input node for generating a third delayed input signal;

a fourth delay means connected to said input node for generating a fourth delayed input signal;

a fifth delay means connected to said input node for generating a fifth delayed input signal;

a first control means, responsive to said input means, for activating three of said switch means in response to said input signal;

a second control means, responsive to said first delayed input signal means, for activating two of said switch means;

a third control means, responsive to said second delayed input signal, for activating one of said switch means;

a fourth control means, responsive to said third delayed input signal, for activating one of said switch means;

a fifth control means, responsive to said fourth delayed input signal, for activating one of said switch means;

a sixth control means, responsive to said fifth delayed input signal, for activating one of said switch means.

* * * * *